United States Patent [19]

Michaud

[11] Patent Number: 5,099,390
[45] Date of Patent: Mar. 24, 1992

[54] MULTIPLE ORIENTATION MOUNTING THERMOSTAT

[75] Inventor: Roger P. Michaud, Lewiston, Me.

[73] Assignee: American Stabilis, Inc., Lewiston, Me.

[21] Appl. No.: 596,933

[22] Filed: Oct. 15, 1990

[51] Int. Cl.⁵ .................................................. H02B 1/20
[52] U.S. Cl. .................................... 361/380; 361/346; 361/399; 361/417; 361/419
[58] Field of Search ............... 361/346, 356, 357, 392, 361/380, 394, 395, 399, 417, 419, 420, 427, 429

[56] References Cited

U.S. PATENT DOCUMENTS

| | | | |
|---|---|---|---|
| 3,523,217 | 8/1970 | Stiles | 361/331 |
| 4,295,180 | 10/1981 | Herron et al. | 361/399 |
| 4,560,972 | 12/1985 | Britt | 361/331 |

*Primary Examiner*—Gregory D. Thompson
*Attorney, Agent, or Firm*—Finnegan, Henderson, Farabow, Garrett & Dunner

[57] ABSTRACT

A thermostat includes a printed circuit board capable of issuing temperature control signals, a wall mountable backplate holding the printed circuit board, signal transfer wire access openings allowing passage of signal transfer wires from a wall through the backplate to the printed circuit board, screw holes in the backplate for attaching the backplate to the wall, and snap clips capable of holding the printed circuit board in a plurality of orientations, the snap clips selectively holding the circuit board in one of the plurality of locations and selectively releasing the circuit board upon the application of force.

11 Claims, 4 Drawing Sheets

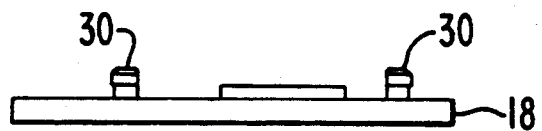
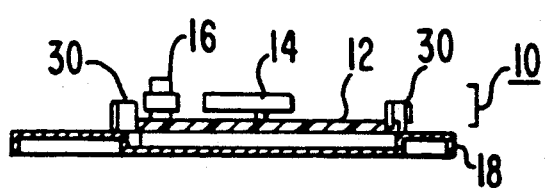 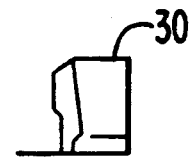

MULTIPLE ORIENTATION MOUNTING THERMOSTAT

BACKGROUND OF THE INVENTION

1. Field of the Invention

The invention relates to a wall mountable thermostat.

2. Description of Related Art

Thermostats are typically walls with the long axis in either a horizontal or vertical orientation. In order to reduce inventory costs, it is desired to stock one thermostat mountable both horizontally and vertically rather than separate horizontally mountable and vertically mountable thermostats. This is especially true for retrofit thermostats which are designed to replace thermostats connected to both vertical junction boxes and horizontal thermostat mountings. No known thermostat is capable of accomplishing both horizontal and vertical mounting with one model.

SUMMARY OF THE INVENTION

It is therefore an object of the present invention to provide a thermostat capable of being mounted in both the horizontal and vertical directions.

This invention provides a thermostat with horizontal and vertical mounting in one model. To convert the thermostat from a vertical to horizontal mounting thermostat, the printed circuit board is simply snapped into the horizontal position and the front cover is replaced. Contractors need not stock additional models, and therefore the thermostat of this invention is ideal for retrofit applications where the previous thermostat was either horizontally or vertically mounted. Furthermore, the thermostat fully covers existing thermostat marks without the need for additional wall plates or sub-bases. This feature simplifies installation and lowers the total installed cost.

In accordance with the purposes of the invention, as embodied and broadly described herein, a thermostat connectable to temperature control signal transfer wires comprises thermostatic control means for issuing temperature control signals, a wall mountable backplate for holding the control means, signal transfer wire access means for allowing passage of the signal transfer wires from a wall through the backplate to the control means, backplate attaching means for attaching the backplate to a wall, and control attaching means for attaching the control means to the backplate in one of a plurality of orientations. The attaching means holds the control means in response to an attaching technique and releases the control means in response to a releasing technique. The resulting thermostat can be moved from one orientation to another orientation by successive applications of the releasing and attaching techniques.

In accordance with the present embodiment, the thermostatic control means comprises a printed circuit board, the signal transfer wire access means comprises an elongated opening formed in the backplate in each of the plurality of orientations, the backplate attaching means comprises screw holes through which screws may be fitted, the attaching technique is a pressing force applied to the printed circuit board, and the releasing technique is a distorting force applied to the backplate. Further, in accordance with the present embodiment, the backplate is less rigid than the printed circuit board.

Further in accordance with the purposes of the present invention, as embodied and broadly described herein, a fixture for holding a printed circuit board comprises a backplate, signal transfer wire access means, backplate attaching means for attaching the backplate in one of a plurality of orientations, and printed circuit board attaching means. The printed circuit board may be other than a thermostatic controller.

The objects and advantages of the invention may be realized and obtained by means of the instrumentalities and combinations particularly pointed out in the appended claims.

BRIEF DESCRIPTION OF THE DRAWINGS

Further features and advantages of the present invention will become apparent from the following detailed description, taken together with the drawings in which:

FIG. 3 is a side view of the wall mountable backplate.

FIG. 4a is a cross-sectional view, at line 4—4 in FIGS. 1 and 2 of the wall mountable backplate with the thermostatic control means placed therein.

FIG. 4b is a detailed view of the snap clip for retaining the thermostatic control means.

DESCRIPTION OF THE PREFERRED EMBODIMENT

Figure 1:
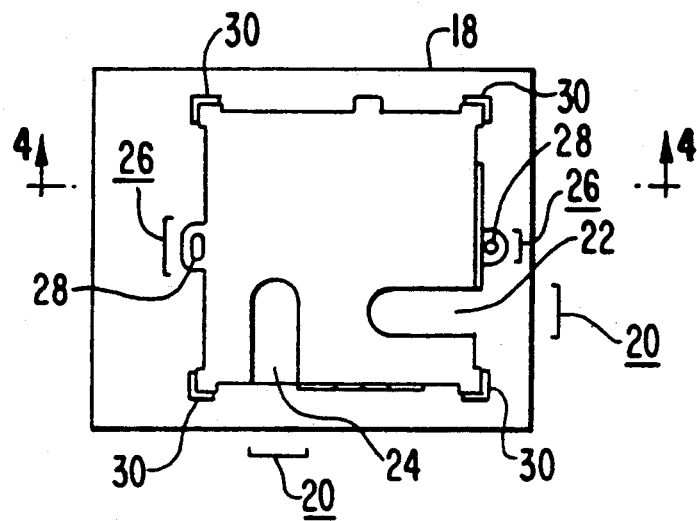
FIG. 1 is a top view of the wall mountable backplate.
Figure 2:
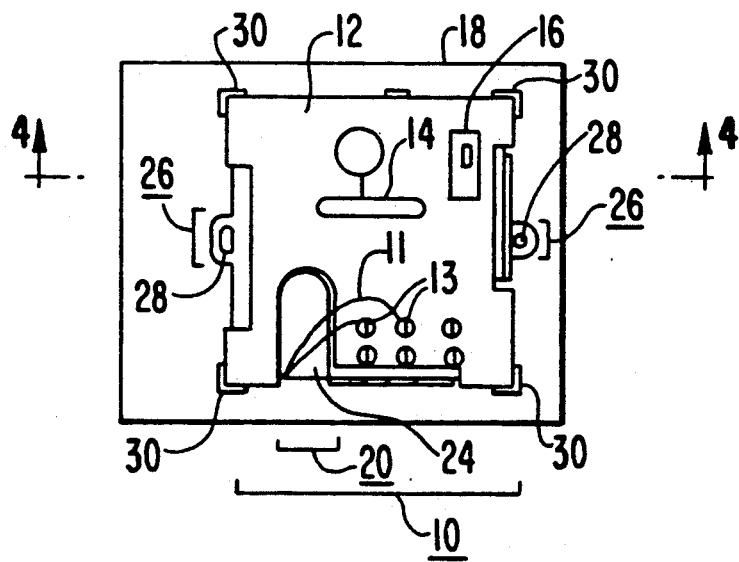
FIG. 2 is a top view of the wall mountable backplate with the thermostatic control means placed therein.

Reference will now be made to the presently preferred embodiment of the invention which is illustrated in the drawings.

The thermostat 2 connectable to temperature control signal transfer wires will now be discussed with reference to FIGS. 1 through 4.

In accordance with the present invention, the thermostat comprises thermostatic control means, a wall mountable backplate, signals transfer wire access means, backplate attaching means for attaching the backplate in one of a plurality of orientations, and thermostatic control means attaching means. As embodied herein, thermostatic control means 10 for issuing temperature control signals includes printed circuit board 12, mercury switch 14, and controls 16. The wall mountable backplate 18 is for holding the thermostatic control means 10. Signal transfer wire access means 20 for allowing passage of the signal transfer wires from the wall through the backplate 18 to the thermostatic control means 10 include elongated vertical opening 22 and elongated horizontal opening 24 formed in backplate 18. Signal transfer wires 11 attached to screw connection 13 on printed circuit board 12. Backplate attaching means 26 for attaching backplate 18 to the wall includes screw holes 28 through which screws (not shown) can be fitted.

As embodied herein, snap clips 30 are provided for holding printed circuit board 12 in one of a plurality of orientations to backplate 18. Preferably, printed circuit board 12 is more rigid than backplate 18. Furthermore, as embodied herein, printed circuit board 12 is attached to backplate 18 by a technique which includes applying a pressing force to the printed circuit board 12 after it is aligned properly with backplate 18. Additionally, the technique for releasing the printed circuit board 12 from backplate 18 includes application of a twisting force to the backplate.

Figure 5:
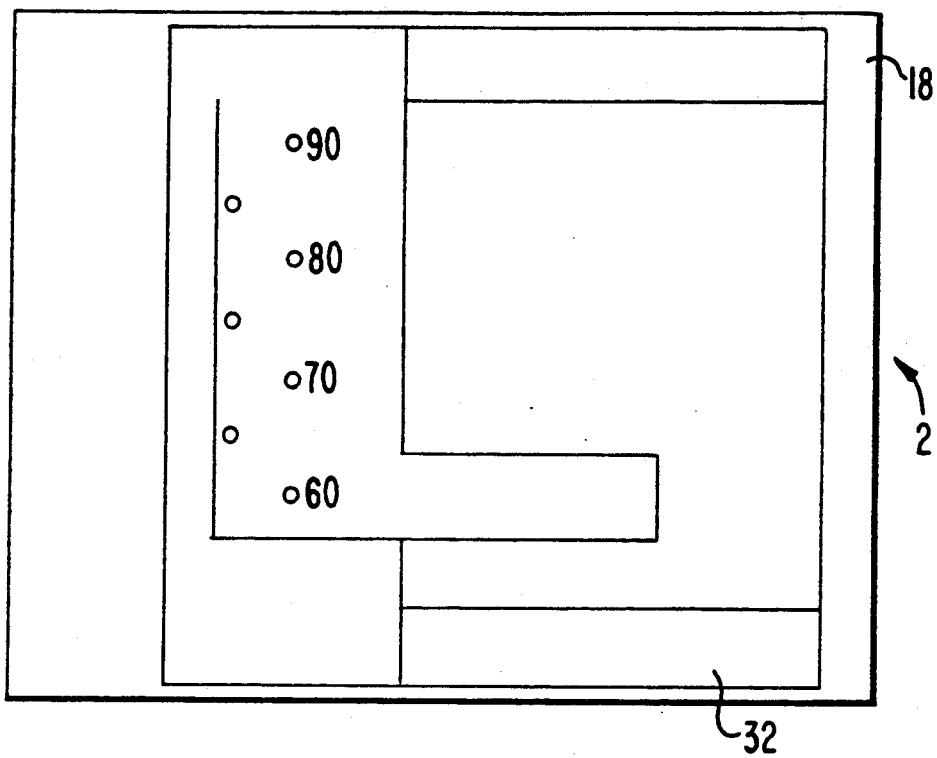
FIG. 5 is a front view of the thermostat mounted in the horizontal position.
Figure 6:
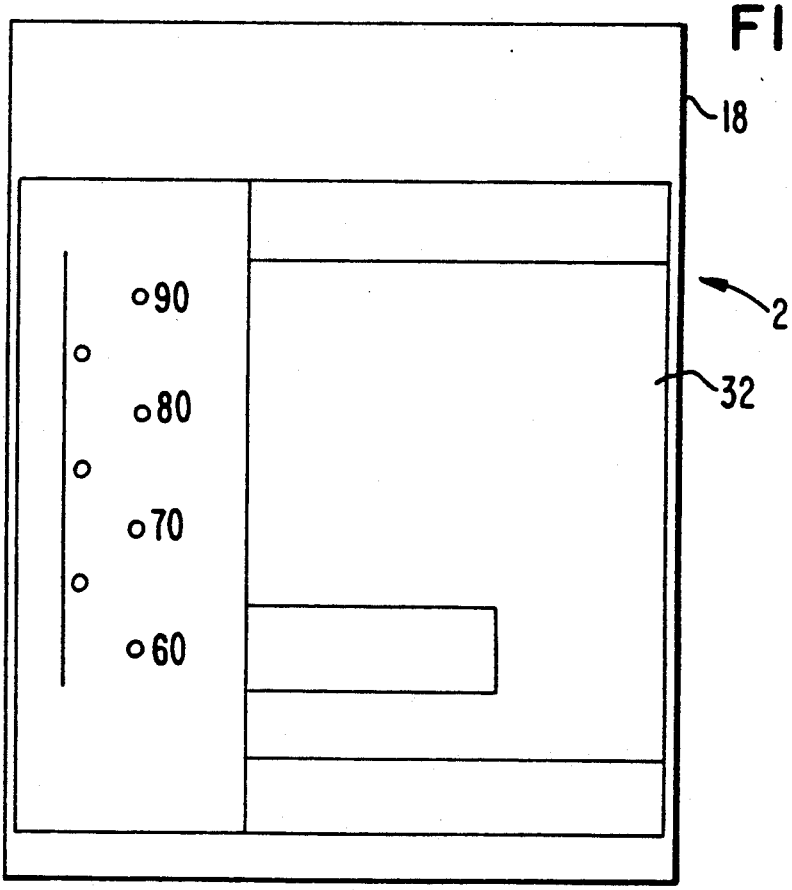
FIG. 6 is a front view of the thermostat mounted in the vertical position.
Figure 7:
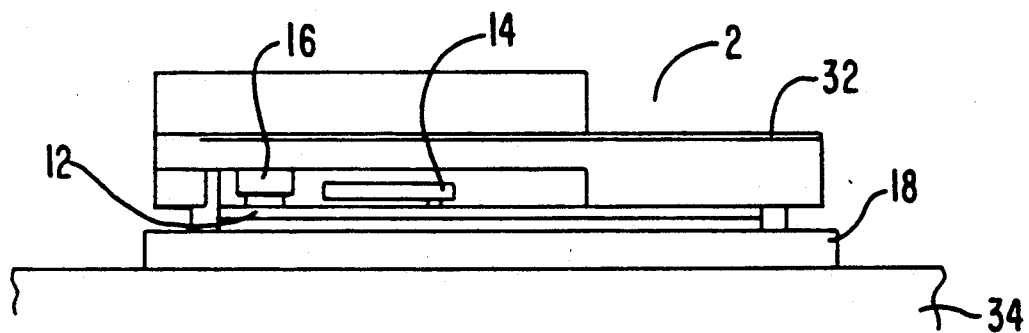
FIG. 7 is a top view of the thermostat mounted in the vertical position.

In operation, the printed circuit board 12 may be placed into backplate 18 in either the vertical or horizontal orientation. This is done by aligning printed circuit board 12 with backplate 18 in the desired orientation and pressing printed circuit board 12 toward backplate 18. Snap clips 30 thereby retain printed circuit board 12 in backplate 18. The orientation of the printed circuit board can be changed by twisting backplate 18 such that it distorts thereby releasing printed circuit board 12 from snap clips 30. Printed circuit board 12 is then aligned in the new orientation and pressed toward backplate 18. As shown in FIGS. 5 and 6 backplate 18 is then attached to a wall and cover 32 is placed over the printed circuit board. FIG. 5 shows the backplate arranged in the horizontal direction with the printed circuit board covered by cover 32 and FIG. 6 shows the backplate 18 arranged in the vertical direction with the printed circuit board covered with cover 32. FIG. 7 shows a top view of the thermostat attached wall 34 with the backplate 18 in the vertical direction. Backplate 18 supports printed circuit board 12 having mercury switch 14 and controls 16 covered by cover 32.

In accordance with the present invention, the backplate, wire access means, backplate attaching means, and printed circuit board attaching means may be used as described above to create a fixture mountable in multiple orientations for holding a printed circuit board other than a thermostat.

The invention provides a thermostat and fixture for holding a printed circuit board mountable in a plurality of orientation. It will be apparent to those skilled in the art that various modifications and variations could be made to the invention without departing from the scope or spirit of the invention.

What is claimed is:

1. A thermostat connectable to temperature control signal transfer wires, comprising:
   thermostatic control means for issuing temperature control signals;
   a wall mountable backplate holding said control means;
   signal transfer wire access means, in said backplate, for allowing passage of the signal transfer wires through said backplate to said thermostatic control means;
   backplate attaching means, in said backplate, for attaching said backplate to a wall; and
   thermostatic control means attaching means, provided on said backplate, for holding said thermostatic control means to said backplate in a plurality of orientations, said attaching means holding said control means in one of the plurality of orientations and said attaching means including means for selectively releasing said control means, said attaching means adapted to allow
   the thermostatic control means to be moved from said one orientation to another of said plurality of orientations by selective holding and releasing the thermostatic control means.

2. The thermostat claimed in claim 1 wherein said thermostatic control means comprises a printed circuit board.

3. The thermostat of claim 1 wherein said signal transfer wire access means comprises an elongated opening formed in the backplate in each of said plurality of orientations.

4. The thermostat of claim 1 wherein the backplate attaching means comprising screw holes through which screws may be fitted.

5. The thermostat of claim 2 wherein the attaching means includes means for holding the printed circuit board in response to an application of force to the printed circuit board and the releasing means is adapted to release said printed circuit board in response to a distorting force to the backplate.

6. The thermostat of claim 2 wherein the backplate is less rigid than the printed circuit board.

7. A backplate for holding a printed circuit board connectable to signal transfer wires, comprising:
   signal transfer wire access means for allowing passage of the signal transfer wires through said backplate to the printed circuit board;
   backplate attaching means for attaching said backplate to the wall;
   printed circuit board attaching means for holding the printed circuit board to said backplate in a plurality of orientations, said attaching means adapted to selectively hold the printed circuit board in one of the plurality of orientations and release the printed circuit board from said one position.

8. The backplate of claim 7 wherein said signal transfer wire access means comprises and elongated opening formed in the backplate in each of said plurality of orientations.

9. The backplate of claim 7 wherein the backplate attaching means comprise screw holes through which screws may be fitted.

10. The backplate of claim 7 wherein the attaching means includes means for holding the printed circuit board in response to an application of force to the printed circuit board and means for releasing the printed circuit board in response to an application of distorting force to the backplate.

11. The backplate of claim 10 wherein the backplate is less rigid than the printed circuit board.

* * * * *